(12) United States Patent
Wellig et al.

(10) Patent No.: US 7,899,022 B2
(45) Date of Patent: Mar. 1, 2011

(54) BLOCK DE-INTERLEAVING SYSTEM

(75) Inventors: Armin Wellig, Nyon (CH); Julien Zory, Fernay Voltaire (FR); Pasquale Imbesi, Scilla (IT)

(73) Assignees: STMicroelectronics N.V., Amsterdam (NL); STMicroelectronics S.R.L., Agrate Brianza (IT)

( * ) Notice: Subject to any disclaimer, the term of this patent is extended or adjusted under 35 U.S.C. 154(b) by 1265 days.

(21) Appl. No.: 11/220,955

(22) Filed: Sep. 7, 2005

(65) Prior Publication Data

US 2006/0050678 A1 Mar. 9, 2006

(30) Foreign Application Priority Data

Sep. 7, 2004 (EP) ..................................... 04292140

(51) Int. Cl.
*H04B 7/216* (2006.01)
(52) U.S. Cl. .......................... 370/342; 714/759
(58) Field of Classification Search .................. None
See application file for complete search history.

(56) References Cited

U.S. PATENT DOCUMENTS

| | | | | |
|---|---|---|---|---|
| 5,686,898 A * | 11/1997 | Willard et al. | ................ | 340/2.8 |
| 5,886,998 A * | 3/1999 | Voith et al. | .................... | 714/702 |
| 5,991,857 A * | 11/1999 | Koetje et al. | .................. | 711/157 |
| 6,035,427 A | 3/2000 | Kweon | .......................... | 714/702 |
| 6,151,690 A * | 11/2000 | Peeters | ......................... | 714/701 |
| 6,781,976 B1 * | 8/2004 | Sonning et al. | .............. | 370/335 |
| 6,785,862 B1 * | 8/2004 | Zhang | ........................... | 714/788 |
| 6,971,057 B1 * | 11/2005 | Delvaux et al. | .............. | 714/788 |
| 7,185,241 B2 * | 2/2007 | Ko et al. | ....................... | 714/701 |
| 7,257,764 B2 * | 8/2007 | Suzuki et al. | .................. | 714/774 |
| 7,376,117 B2 * | 5/2008 | Erlich et al. | .................... | 370/343 |
| 2002/0046329 A1 * | 4/2002 | Song | ............................. | 711/157 |
| 2003/0014700 A1 | 1/2003 | Giulietti et al. | ............... | 714/701 |
| 2003/0048206 A1 | 3/2003 | Gatherer et al. | ................ | 341/50 |
| 2003/0091109 A1 * | 5/2003 | Okunev et al. | ................ | 375/222 |
| 2003/0097621 A1 * | 5/2003 | Xin | ................................ | 714/701 |
| 2003/0128722 A1 | 7/2003 | Woodard | ....................... | 370/536 |
| 2004/0213183 A1 * | 10/2004 | Barry et al. | .................... | 370/335 |
| 2005/0190864 A1 * | 9/2005 | Pan et al. | ...................... | 375/320 |
| 2005/0254441 A1 * | 11/2005 | Levi et al. | ..................... | 370/277 |
| 2006/0153308 A1 * | 7/2006 | Xu et al. | ....................... | 375/259 |

FOREIGN PATENT DOCUMENTS

| | | |
|---|---|---|
| EP | 1 304 810 | 4/2003 |
| FR | 2 834 152 | 6/2003 |

OTHER PUBLICATIONS

Imbesi et al., "Flexible Multi-Bank Architecture for Power-Constraint 3GPP-HSPDA Deinterleaving Applications", published by Advanced System Technology, STMicroelectronics, Catania, Italy, p. 1-4.

* cited by examiner

*Primary Examiner* — Phirin Sam
(74) *Attorney, Agent, or Firm* — Lisa K. Jorgenson; Allen, Dyer, Doppelt, Milbrath & Gilchrist, P.A.

(57) ABSTRACT

The block de-interleaving system includes an input for receiving a set of time-aligned blocks or interleaved data, physical memory unit, and a de-interleaving block for writing the blocks in the memory in a first predetermined manner and reading the blocks from the memory in a second predetermined manner to de-interleave the data of the blocks. The physical memory unit may include several different physical memories, and the de-interleaving block is adapted to completely write and read a block into and from one physical elementary memory.

13 Claims, 7 Drawing Sheets

BLOCK DE-INTERLEAVING SYSTEM

FIELD OF THE INVENTION

The present invention relates in general to block de-interleaving systems. The invention is applicable to the field of wireless communication systems, and more particularly to the Code Division Multiple Access (CDMA) systems such as the different CDMA based mobile radio systems, and more particularly to the 3rd Generation Partnership Project (3GPP) systems operating in accordance with the known 3GPP standard.

BACKGROUND OF THE INVENTION

An interleaving device is, in particular, located between a channel encoding device and a modulator device. In the same way, a de-interleaving device is located between a demodulator device and a channel decoding device. Interleaving is scrambling the processing order to break up neighborhood-relations in successive data samples, and de-interleaving brings them into the original sequences again. Channel de-interleaving is a memory intensive operation which is among the most energy usage operations in digital high-throughput receivers. There are two standard channel interleaving and de-interleaving techniques commonly referred as "block" and "convolutional".

The invention is more particularly directed to block interleavers which are used in various cellular systems, for example in 3GPP or IS-95. State-of-the-art implementations use a single large physical memory for de-interleaving, and suffer high energy dissipation due to numerous sample-wide accesses to the large memory, where one sample is composed of several bits.

Moreover, block de-interleaving results in memory spaces with long storage-lifetimes which drastically limits continuous memory re-use. As a result, large adaptation buffers are required that further increases the area of the circuit and the energy dissipation. So, in conventional de-interleaving approaches, this memory intensive operation is both power consuming due to frequent accesses to large memories and area inefficient due to large adaptation buffers.

SUMMARY OF THE INVENTION

The invention provides an approach capable of interleaving interleaved data samples with significantly reducing the overall number of memory accesses in the presence of several time-aligned physical channels. Moreover, the de-interleaving memory content can be flushed at a significantly faster rate thereby reducing the size of the adaptation buffer.

Thus the invention provides a block de-interleaving system including input device/means for receiving a set of time-aligned blocks of interleaved data, physical memory or memory means, and a de-interleaver or de-interleaving means for writing the blocks in the memory in a first predetermined manner and reading the blocks from the memory in a second predetermined manner to de-interleave the data of the blocks.

The physical memory means comprise several (at least two) different physical elementary memories, and the de-interleaving means are adapted to totally write and read a block into and from one physical elementary memory. Each block of the set is associated for example to one physical channel which delivers, when it is active, successive blocks which are successively de-interleaved. In other words the input means receive in such an example successive sets of independent and time-aligned blocks of data successively and respectively associated to all the active physical channels. This is simply a means to dynamically adjust the data throughput.

The memory space allocated for de-interleaving the successive blocks associated to a physical channel is located within one elementary memory and is not shared among different elementary memories. Of course an elementary memory can contain several different memory spaces respectively allocated to several different blocks associated to several different active physical channels.

The memory access energy reduces with the storage size. Furthermore, not having a single physical memory allows an increase in the overall storage bandwidth. Indeed, that is, since independent blocks can be mapped to different memory elements, they can be accessed concurrently. Thus, a storage unit composed of more than one physical memory element allows having several accesses to the physical memory set several per cycle, and then increases the de-interleaver output throughput, so the size of the respective adaptation FIFO queues associated the physical channels can be decreased.

In a preferred embodiment, the physical elementary memories have substantially the same memory size and have the same bandwidth. In a preferred embodiment, the physical elementary memories have different bandwidths and can store substantially the same number of words. The de-interleaving means comprise a packing unit for respectively concatenating time-aligned data of some of the blocks to form words having a size corresponding to the bandwidths of the physical memories in which these words are destined to be respectively stored. Indeed, the access energy increases less than linearly with the accessed word size, or bandwidth, for a fixed memory size. So this embodiment permits to optimize the area of the circuit and the energy used.

According to another aspect of the invention, an element of a wireless communication system includes a system as above described, for example defining a cellular mobile phone.

BRIEF DESCRIPTION OF THE DRAWINGS

Other advantages and features of the invention will appear on examining the detailed description of non-limiting embodiments, and of the appended drawings in which.

DETAILED DESCRIPTION OF THE PREFERRED EMBODIMENTS

Figure 1:
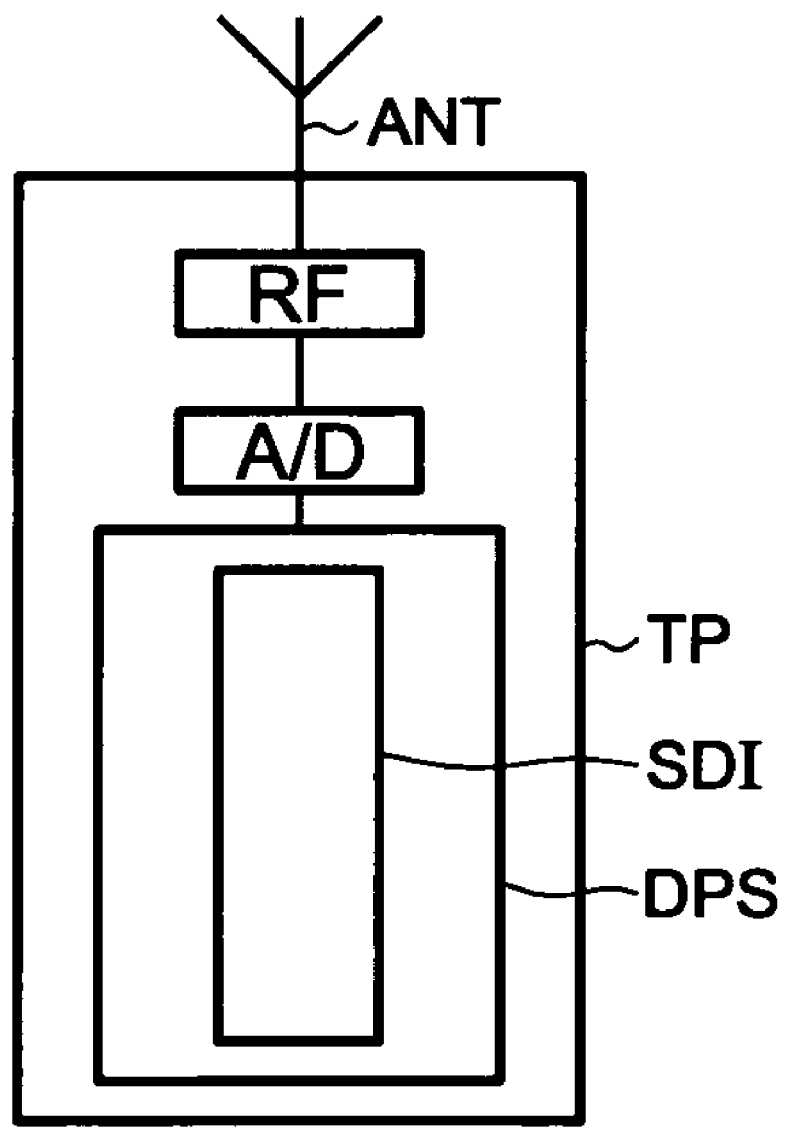
FIG. 1 is a schematic diagram showing a cellular mobile phone with a system according to the invention.

Referring initially to FIG. 1, which illustrates a de-interleaving system according to the invention, which is incorporated in the reception chain of a cellular mobile phone TP, although the invention is not limited to this particular application. The interleaved signal is received by the antenna ANT and processed by the radio frequency stage RF of the receiver. At the output of the RF stage, the signal is converted into the digital domain by an A/D converter. The converted signal is transmitted to a digital process stage DPS which comprises a system SDI of de-interleaving according to the invention, and processes the digital base band signal.

Figure 2:
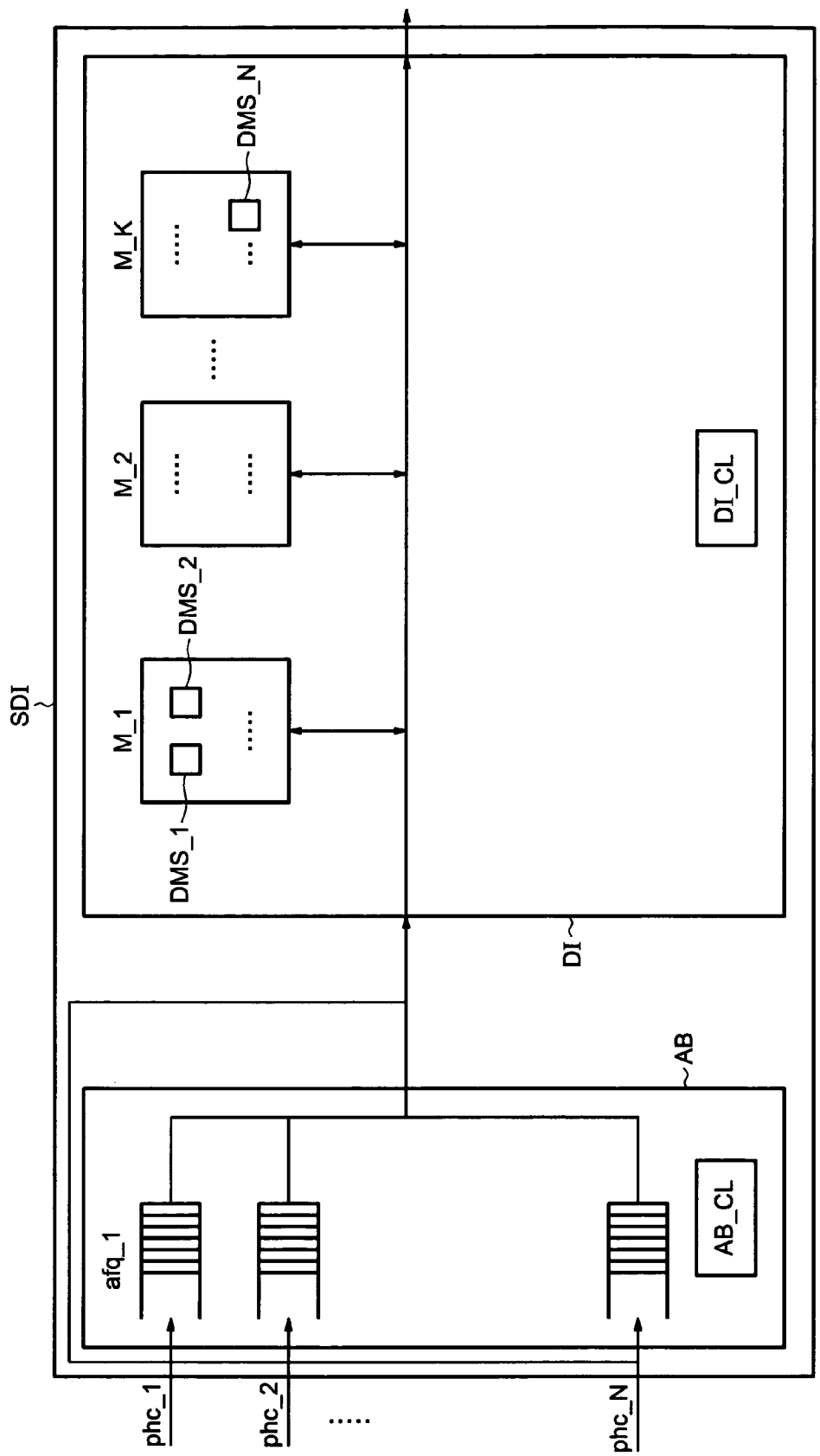
FIG. 2 is a schematic diagram showing a first embodiment of a system according to the invention.

Referring to the FIG. 2, a de-interleaving system SDI according to the invention is represented. The system comprises an adaptation buffer module AB and a de-interleaver module DI. The de-interleaving system SDI comprises an input or input means connected to N physical channels phc_1, phc_2, . . . , phc_N and linked to N respective adaptation FIFO queues afq_1, afq_2, . . . , afq_N, and linked to the de-interleaver module D1. At a time, only a number of physical channels comprised between 0 and N, are active. The adaptation buffer module AB also comprises a control module AB_CL adapted for controlling the adaptation buffer module AB, the adaptation FIFO queues afq_1, afq_2, . . . afq_N, and the physical channels phc_1, phc_2, . . . , phc_N inputs.

The de-interleaver module DI comprises K physical elementary memories M_1, M_2, . . . , M_K, with K at least equal to two. Each physical elementary memory comprises at least one de-interleaving memory space DMS_1, DMS_2, . . . , DMS_M, respectively associated to the physical channels phc_1, phc_2, . . . , phc_N. A de-interleaving memory space DMS_I with I being between 1 and M, specifies the number of data samples contained in one block to be block de-interleaved. The de-interleaver module DI also comprises a control module DI_CL adapted for controlling the de-interleaver module DI, and so the physical memory blocks M_1, M_2, . . . , M_K. The two control modules AB_CL and DI_CL are linked together.

When a block of soft bits arrives on a physical channel if the associated de-interleaving memory space is free, in other words if the precedent block received by the physical channel has been de-interleaved, data of the block are directly stored in the associated de-interleaving memory space to be de-interleaved. More precisely, the data of the block are written column by column based on the inter-column permutation index (which is characteristic for the reshuffling law of pseudorandom block interleavers) and read row by row to be delivered de-interleaved at the output of the system. If not, soft bits of the block are temporary stored in the associated adaptation FIFO queue afq_i. A soft bit corresponds to a binary information encoded on several hard bits or bits depending on the required precision. The value of each soft bit varies theoretically from $-\infty$ to $=\infty$. The control module AB-CL of the buffer module AB controls this storage of data.

In a first embodiment, the physical elementary memories have substantially the same memory size, and have the same bandwidth. A memory bandwidth is the size of word for example eight hard bits, which is often referred to as addressable memory. Using at least two physical elementary memories to embody the de-interleaving spaces DMS_1, DMS_2, . . . , DMS_N, permits to increase the number of accesses to the memory per cycle, and so to increase the output throughput of the de-interleaving system SDI. Indeed, with K physical elementary memories, there are K times more accesses per cycle. With the increase of output throughput, the size of the adaptation FIFO queues afq_1, afq_2, . . . afq_N, can be reduced and so the number of accesses to adaptation FIFO queues afq_1, afq_2, . . . afq_N. So, the area and the energy used are decreased.

The example described in the description is in a CMOS process technology, where the time to access the memory is in the order of a few nanoseconds, the limiting factor is the bandwidth rather than the pure access latency.

Figure 3:
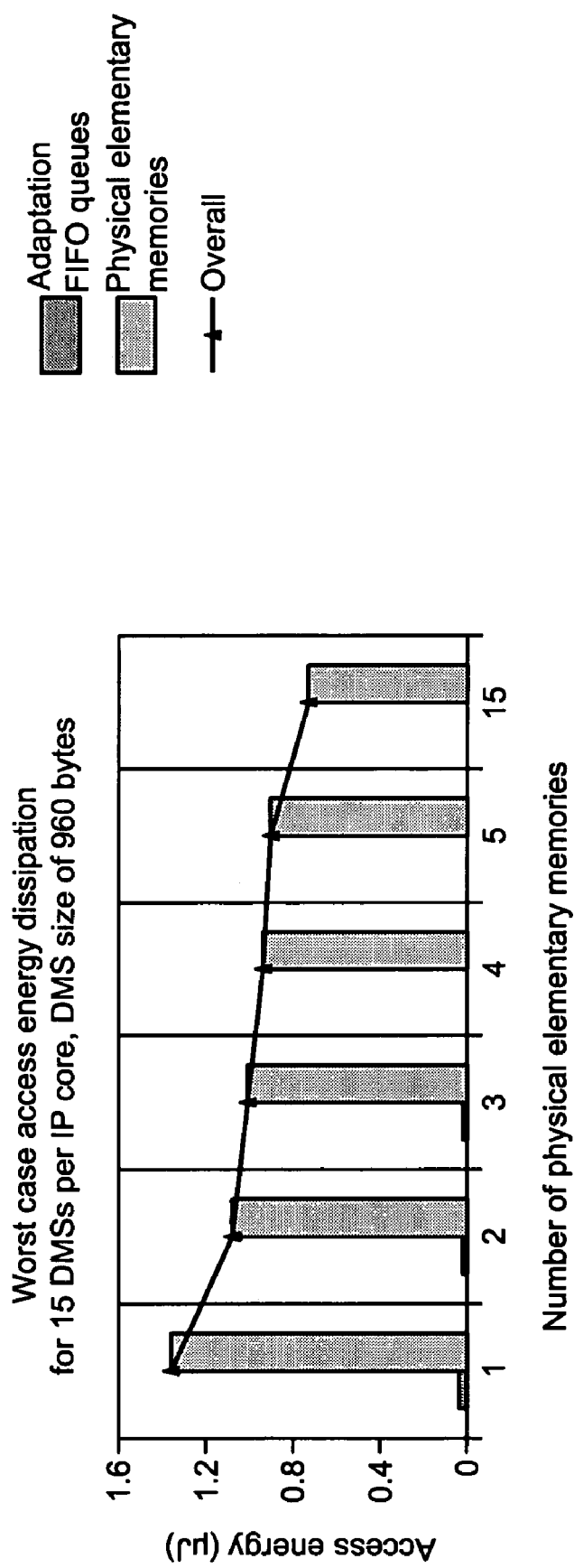
FIG. 3 is a graph illustrating the access energy dissipation for a system according to the FIG. 1, depending on the number of physical elementary memories.

As illustrated on the FIG. 3, the access energy dissipation decreases with the increase of the number K of physical elementary memories M_1, M_2, . . . , M_K. However the number of separated physical elementary memories M_1, M_2, . . . , M_K, can not be too high, because when the size of a physical elementary memory becomes too small, the size of the associated address decoding logic becomes more important than the size of the physical elementary memory. In other words, the duplication of address decoding logic of each memory element limits the area efficiency when implementing a number of independent elements compared to a single physical memory approach. Of course, an increase in throughput can still be achieved. So for a chosen technology, those skilled in the art will now implement the best number of separated physical elementary memories taking into account the estimated energy dissipation and the size of the circuit. Moreover, the size of the adaptation FIFO queues afq_1, afq_2, . . . , afq_N, can be reduced according to the number separated physical elementary memories, and so decrease the energy dissipation of the de-interleaving system SDI.

Figure 4:
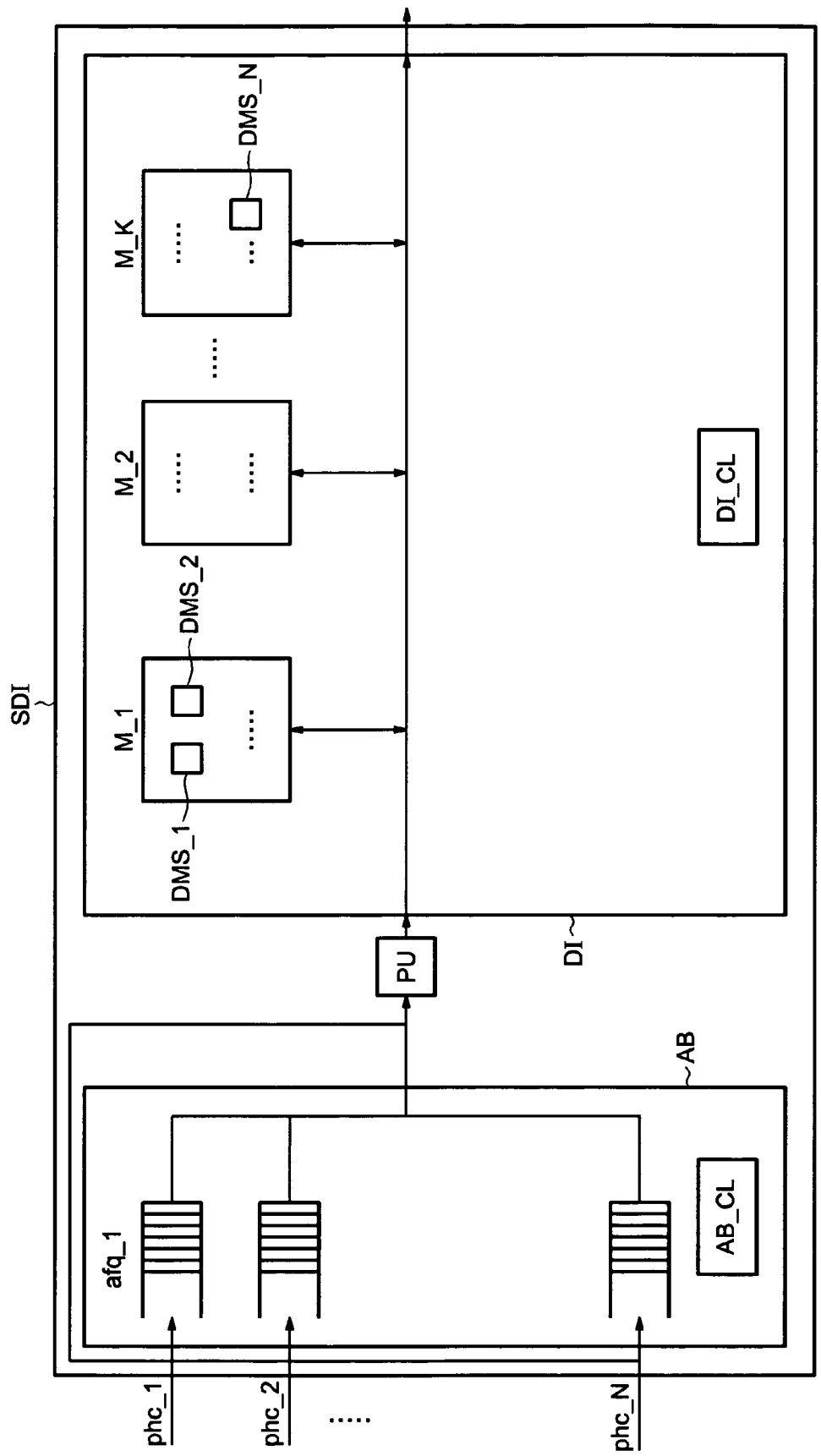
FIG. 4 is a schematic diagram showing a second embodiment of a system according to the invention.

FIG. 4 represents a preferred embodiment of a interleaving system according to the invention, comprising a packing unit PU and at least two physical elementary memories M_1, M_2, . . . , M_K. The packing unit PU is capable of respectively packing several time-aligned soft bits of time-aligned blocks received on the active physical channels among the N physical channels phc_1, phc_2, . . . , phc_N.

The physical elementary memories can store data of different size. In other words, each physical memory has its own access size. For example, with four physical elementary memories, the first physical elementary memory holds 960 samples of eight bits (i.e., 8-bit wide accesses), the second physical elementary memory holds 960 samples of sixteen bits (i.e., 16-bit wide accesses), the third physical elementary memory holds 960 samples of thirty-two bits (i.e., 32-bit wide accesses), and the fourth physical elementary memory holds 960 samples of sixty-four bits (i.e., 64-bit wide accesses).

Indeed, the access energy increases less than linearly with access bandwidth for a fixed memory size. For example, storing sixteen bits by twice accessing eight bits in a SRAM memory is less energy-efficient than only once accessing sixteen bits. Of course, storing words of sixteen bits instead of words of eight bits, is interesting if all the bits in the corresponding words are used for further processing and it is not necessary to later re-access the same to extract for example a sub-word composed of eight bits.

In the example above-cited with four physical elementary memories, if three physical channels are active at a time, and if a soft bit has a size of eight hard bits, the packing unit respectively packs two soft bits together on the three aligned soft bits received. Then a data sample of eight bits is stored in the first physical elementary memory having an eight bits bandwidth, and a data sample of sixteen bits is stored in the second physical elementary memory having a sixteen bits bandwidth.

The embodiment of the FIG. 4 is optimized compared with the first embodiment of the FIG. 2, as discussed in the rest of the description. The embodiment represented in the FIG. 2 can be called fixed bandwidth, and the embodiment represented in the FIG. 4 can be called flexible bandwidth.

Figure 5:
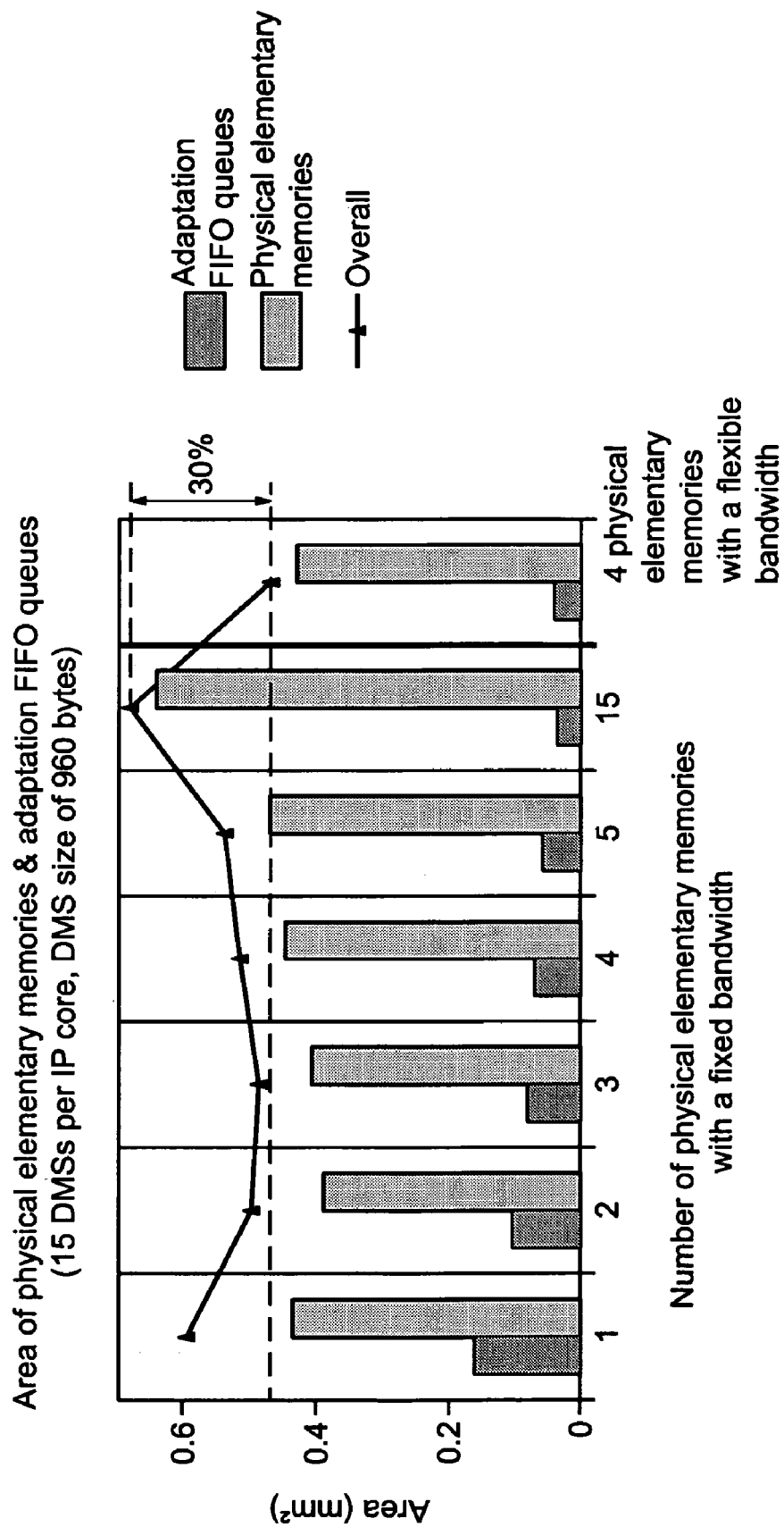
FIG. 5 is a graph illustrating a comparison of estimate area with a system as illustrated in FIG. 2 and a system as illustrated in FIG. 4.

FIG. 5 shows a comparison between the above-cited two embodiments respectively represented in FIGS. 2 and 4. FIG. 5 shows clearly that the second embodiment is better, because it optimizes the area of the physical elementary memories $M\_1, M\_2, \ldots, M\_K$ and the area of the adaptation FIFI queues $afq\_1, afq\_2, \ldots, afq\_N$. In this example, the best optimization corresponds to four physical elementary memories with a flexible bandwidth.

Figure 6:
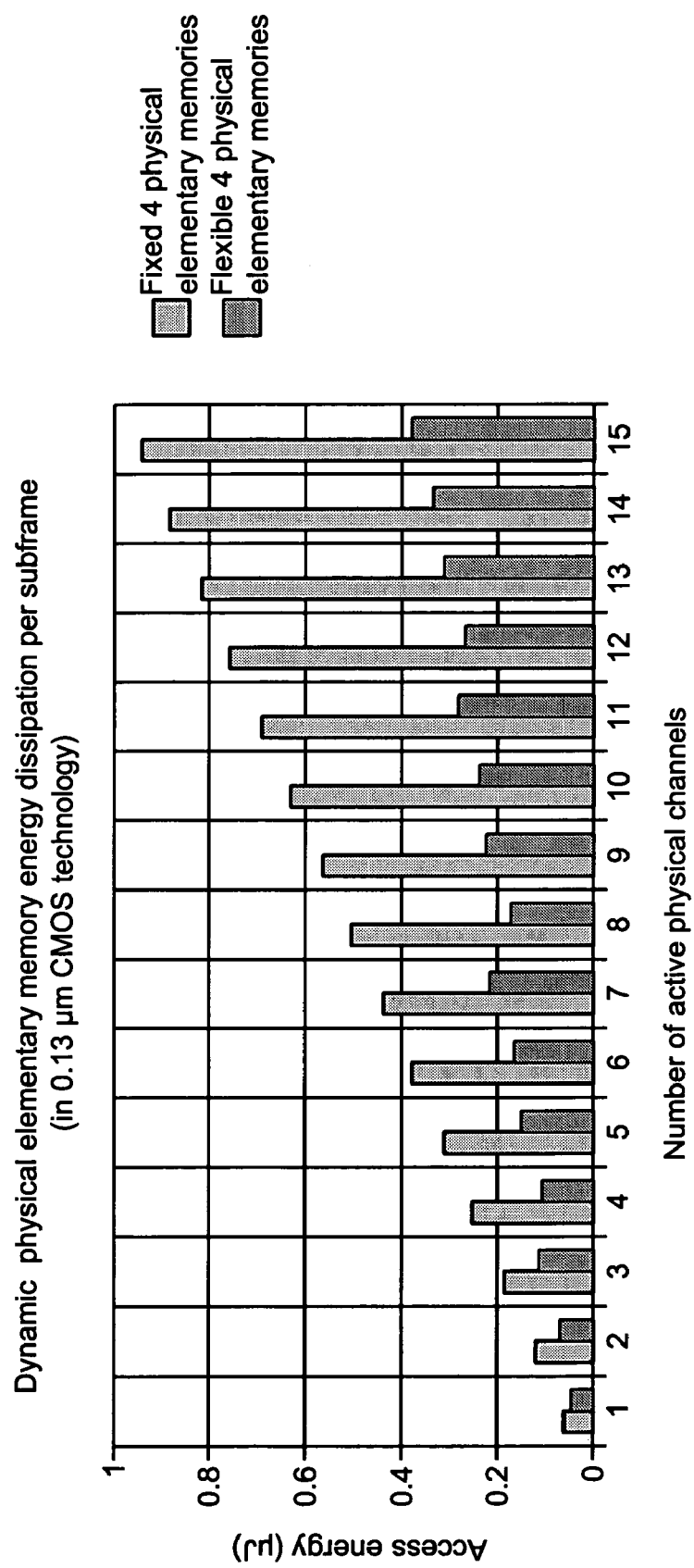
FIG. 6 is a graph illustrating a comparison of energy dissipation with a system as illustrated in FIG. 2 and a system as illustrated in FIG. 4.

FIG. 6 shows a comparison of energy dissipation per subframe, for the above-cited example, between a four physical elementary memories system with the same bandwidth and a physical elementary memories system with different bandwidth (flexible bandwidth). The FIG. 6 shows that using four physical elementary memories with different bandwidths is better for the energy consumed than with the same bandwidth, whatever the number of active physical channels.

Figure 7:
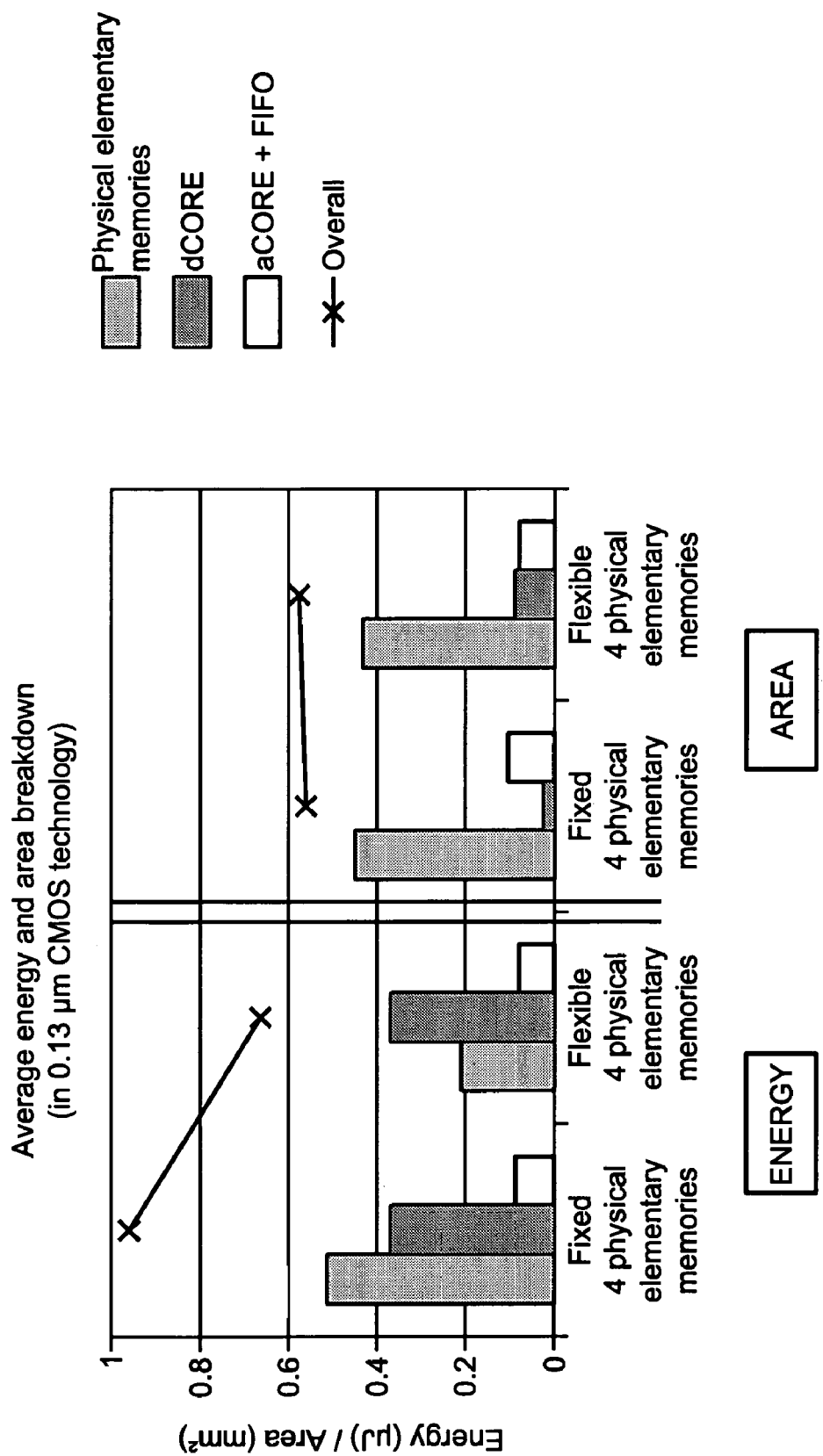
FIG. 7 is a graph illustrating a comparison of energy dissipation and of area with a system as illustrated in FIG. 2 and a system as illustrated in FIG. 4.

Finally, the FIG. 7 is a comparison between area and energy used by the two embodiments of the invention, in the above-cited examples of four physical elementary memories, with a fixed bandwidth and with a flexible bandwidth. In FIG. 7, is represented a comparison of energy dissipation and of area with a system as illustrated in FIG. 2 and a system as illustrated in FIG. 4. The energy used is less important for such a system with flexible bandwidth than with fixed bandwidth.

That which is claimed is:

1. A data block de-interleaving system comprising:
   an input for receiving a set of time-aligned blocks of interleaved data;
   a memory unit comprising a plurality of different elementary memories; and
   a de-interleaving device for writing the data blocks in the memory unit in a first manner and reading the data blocks from the memory unit in a second manner to de-interleave the data of the data blocks, the de-interleaving device completely writing and reading a data block into and from one elementary memory.

2. The system according to claim 1, wherein each of the elementary memories has substantially the same memory size and the same bandwidth.

3. The system according to claim 1, wherein each of the elementary memories has a different bandwidth and can store substantially the same number of words.

4. The system according to claim 3, wherein the de-interleaving device comprises a packing unit for respectively concatenating time-aligned data of at least some of the data blocks to form words having a size corresponding to the bandwidths of the elementary memories in which the words are to be respectively stored.

5. A wireless communication device for a wireless communication system comprising:
   a data block de-interleaving system including
   an input for receiving a set of time-aligned blocks of interleaved data,
   a memory unit comprising a plurality of different elementary memories, and
   a de-interleaving device for writing the data blocks in the memory unit in a first manner and reading the data blocks from the memory unit in a second manner to de-interleave the data of the data blocks, the de-interleaving device completely writing and reading a data block into and from one elementary memory.

6. The device according to claim 5, wherein each of the elementary memories has substantially the same memory size and the same bandwidth.

7. The device according to claim 5, wherein each of the elementary memories has a different bandwidth and can store substantially the same number of words.

8. The device according to claim 7, wherein the de-interleaving device comprises a packing unit for respectively concatenating time-aligned data of at least some of the data blocks to form words having a size corresponding to the bandwidths of the elementary memories in which the words are to be respectively stored.

9. The device according to claim 5, wherein the device comprises a cellular mobile phone.

10. A method of data block de-interleaving comprising:
    receiving a set of time-aligned blocks of interleaved data;
    providing a memory unit comprising a plurality of different memories; and
    writing the data blocks in the memory unit in a first manner and reading the data blocks from the memory unit in a second manner to de-interleave the data of the data blocks, including completely writing and reading a data block into and from one memory.

11. The method according to claim 10, wherein each of the memories has substantially the same memory size and the same bandwidth.

12. The method according to claim 10, wherein each of the memories has a different bandwidth and can store substantially the same number of words.

13. The method according to claim 12, wherein writing includes respectively concatenating time-aligned data of at least some of the data blocks to form words having a size corresponding to the bandwidths of the memories in which the words are to be respectively stored.

* * * * *

UNITED STATES PATENT AND TRADEMARK OFFICE
CERTIFICATE OF CORRECTION

| | | |
|---|---|---|
| PATENT NO. | : 7,899,022 B2 | |
| APPLICATION NO. | : 11/220955 | |
| DATED | : March 1, 2011 | |
| INVENTOR(S) | : Wellig et al. | |

It is certified that error appears in the above-identified patent and that said Letters Patent is hereby corrected as shown below:

Column 1, Line 47      Delete: "with"
Insert: --while--

Column 2, Line 19      Delete: "several"

Column 2, Line 21      Delete: "associated the"
Insert: --associated with the--

Column 2, Line 49      Delete: "the FIG. 1"
Insert: --FIG. 1--

Column 3, Line 10      Delete: "the FIG. 2,"
Insert: --FIG. 2,--

Column 3, Line 47      Delete: "temporary"
Insert: --temporarily--

Column 3, Line 55      Delete: "of word"
Insert: --of a word--

Column 4, Line 5      Delete: "on the"
Insert: --in--

Column 4, Line 25      Delete: "of a interleaving"
Insert: --of an interleaving--

Column 4, Line 33      Delete: "size."
Insert: --sizes.--

Signed and Sealed this
Sixth Day of September, 2011

David J. Kappos
*Director of the United States Patent and Trademark Office*

CERTIFICATE OF CORRECTION (continued)
U.S. Pat. No. 7,899,022 B2

Column 4, Line 60        Delete: "the FIG. 4"
                                              Insert: --FIG. 4--

Column 4, Line 61        Delete: "the FIG. 2"
                                              Insert: --FIG. 2--

Column 4, Line 62        Delete: "the FIG. 2"
                                              Insert: --FIG. 2--

Column 4, Line 64        Delete: "the FIG. 4"
                                              Insert: --FIG. 4--

Column 5, Line 14        Delete: "the FIG. 7"
                                              Insert: --FIG. 7--